United States Patent
Kannou et al.

(10) Patent No.: US 8,513,047 B2
(45) Date of Patent: Aug. 20, 2013

(54) METHOD FOR FRACTURING SEMICONDUCTOR SUBSTRATE, METHOD FOR FRACTURING SOLAR CELL, AND THE SOLAR CELL

(71) Applicant: Sanyo Electric Co., Ltd, Moriguchi (JP)

(72) Inventors: Hiroyuki Kannou, Kishiwada (JP); Masaki Shima, Uji (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/688,281

(22) Filed: Nov. 29, 2012

(65) Prior Publication Data

US 2013/0084671 A1    Apr. 4, 2013

Related U.S. Application Data (63) Continuation of application No. 12/046,534, filed on Mar. 12, 2008, now Pat. No. 8,389,320.

(30) Foreign Application Priority Data

Mar. 20, 2007 (JP) .................. 2007-072085

(51) Int. Cl.
 *H01L 21/00* (2006.01)
 *H01L 31/00* (2006.01)
(52) U.S. Cl.
 USPC ............. 438/68; 438/462; 257/E31.002
(58) Field of Classification Search
 None
 See application file for complete search history.

(56) References Cited

U.S. PATENT DOCUMENTS

| | | | |
|---|---|---|---|
| 5,314,844 A | | 5/1994 | Imamura |
| 5,814,532 A | * | 9/1998 | Ichihara ................... 438/33 |
| 7,755,157 B2 | | 7/2010 | Asaumi et al. |
| 8,389,320 B2 | * | 3/2013 | Kannou et al. ............ 438/68 |
| 2002/0106874 A1 | | 8/2002 | Iwane et al. |
| 2005/0118790 A1 | | 6/2005 | Lee et al. |
| 2007/0031986 A1 | | 2/2007 | Nishimoto |
| 2007/0158621 A1 | | 7/2007 | Sakamoto et al. |

FOREIGN PATENT DOCUMENTS

| | | |
|---|---|---|
| DE | 10347647 A1 | 5/2005 |
| EP | 0562880 A1 | 9/1993 |
| EP | 1195352 A1 | 4/2002 |
| EP | 1278236 A1 | 1/2003 |
| JP | 59-152638 A | 8/1984 |
| JP | 62-068255 U | 4/1987 |
| JP | 62105446 A | 5/1987 |
| JP | 07-094764 A | 4/1995 |
| JP | 09-148601 A | 6/1997 |
| JP | 2001-094127 A | 4/2001 |
| JP | 2005-167190 A | 6/2005 |
| JP | 2006-310774 A | 11/2006 |
| JP | 2007-026934 A | 2/2007 |
| JP | 2007-042940 A | 2/2007 |
| JP | 2007-044974 A | 2/2007 |

* cited by examiner

*Primary Examiner* — Seahvosh Nikmanesh
(74) *Attorney, Agent, or Firm* — Marvin A. Motsenbocker; Mots Law, PLLC (57) ABSTRACT

In accordance with the present invention, the dividing grooves 8 are formed so as not to be parallel to cleavage planes of the semiconductor substrate 1, and the semiconductor substrate 1 is bent along the dividing grooves 8, whereby the semiconductor substrate 1 is fractured along the dividing grooves 8.

7 Claims, 6 Drawing Sheets

METHOD FOR FRACTURING SEMICONDUCTOR SUBSTRATE, METHOD FOR FRACTURING SOLAR CELL, AND THE SOLAR CELL

CROSS REFERENCE TO RELATED APPLICATIONS

This application is a continuation of application Ser. No. 12/046,534, filed on Mar. 12, 2008, now U.S. Pat. No. 8,389,320 B2, which is based upon and claims the benefit of priority from the prior Japanese Patent Application No. 2007-072085, filed on Mar. 20, 2007, the entire contents of which is incorporated herein by reference.

BACKGROUND OF THE INVENTION

1. Field of the Invention

The present invention relates to a method for fracturing a semiconductor substrate by bending the semiconductor substrate, to a method for fracturing a solar cell, and to the solar cell.

2. Description of the Related Art

Heretofore, as a semiconductor substrate for use in a solar cell, a single crystal silicon substrate obtained by thinly cutting ingot-like single crystal silicon has been used. The ingot-like single crystal silicon is fabricated by the Czochralski process (CZ process) and the floating zone process (FZ process) or the like, and has the same crystal orientation as that of seed crystal.

In the case of using the single crystal silicon substrate as the semiconductor substrate of the solar cell, the single crystal silicon substrate that is disc-like is used after being divided into polygonal pieces in order to increase a light receiving area of a solar cell module (for example, refer to Japanese Patent Laid-Open No. H9-148601 (published in 1997)). Specifically, there has been adopted a method for fracturing the single crystal silicon substrate by forming a plurality of dividing grooves on the single crystal silicon substrate by means of a laser, a dicing saw or the like, and thereafter bending the single crystal silicon substrate along the dividing grooves.

BRIEF SUMMARY OF THE INVENTION

A method for fracturing a semiconductor substrate according to a first feature of the present invention is summarized to include: forming dividing grooves having a predetermined depth on the semiconductor substrate; and fracturing the semiconductor substrate along the dividing grooves by bending the semiconductor substrate along the dividing grooves, wherein the dividing grooves are not parallel to a cleavage plane of the semiconductor substrate.

In accordance with the method for fracturing a semiconductor substrate according to the first feature of the present invention, the dividing grooves are formed so as not to be parallel to the cleavage plane of the semiconductor substrate, and the semiconductor substrate is bent along the dividing grooves, whereby the semiconductor substrate is fractured along the dividing grooves. Hence, since the dividing grooves are not parallel to the cleavage plane of the semiconductor substrate, the uniform force can be applied to all the dividing grooves in the case of fracturing the semiconductor substrate. Specifically, the stress is not concentrated on a part of the semiconductor substrate in the case of fracturing the semiconductor substrate. As a result, the semiconductor substrate is fractured without causing any breakage, and accordingly, yield in a fracturing step for the semiconductor substrate can be enhanced.

A method for fracturing a solar cell according to a second feature of the present invention is summarized to include: forming a photoelectric conversion part having a semiconductor pn or pin junction using a semiconductor substrate; forming collecting electrodes in a predetermined pattern on the photoelectric conversion part; forming dividing grooves having a predetermined depth on the photoelectric conversion part in response to the predetermined pattern; and fracturing the photoelectric conversion part along the dividing grooves by bending the photoelectric conversion part along the dividing grooves, wherein the dividing grooves are not parallel to a cleavage plane of the semiconductor substrate.

A solar cell according to a third feature of the present invention is summarized to include: a photoelectric conversion part having a semiconductor pn or pin junction using a semiconductor substrate; and collecting electrodes formed in a predetermined pattern on the photoelectric conversion part, wherein a side surface of the photoelectric conversion part includes a fractured surface that is fractured by bending the photoelectric conversion part, and the fractured surface is not parallel to a cleavage plane of the semiconductor substrate.

In accordance with the present invention, the method for fracturing a semiconductor substrate, the method for fracturing a solar cell, and the solar cell, which apply the uniform force to all the dividing grooves in the case of fracturing the semiconductor substrate, can be provided.

BRIEF DESCRIPTION OF THE SEVERAL VIEWS OF THE DRAWINGS

FIGS. 8A to 8c are views showing components of the fracturing apparatus shown in FIG. 7.

DETAILED DESCRIPTION OF THE INVENTION

Next, a description will be made of embodiments of the present invention. In the following description of the drawings, the same or similar reference numerals are assigned to the same or similar portions. However, it should be noted that the drawings are schematic, and that ratios of the respective dimensions, and the like are different from actual ones. Hence, specific dimensions and the like should be determined in consideration for the following description. Moreover, it is a matter of course that portions in which mutual dimensional relationships and ratios are different among the drawings are incorporated therein.

Configuration of Solar Cell Module

Figure 1:
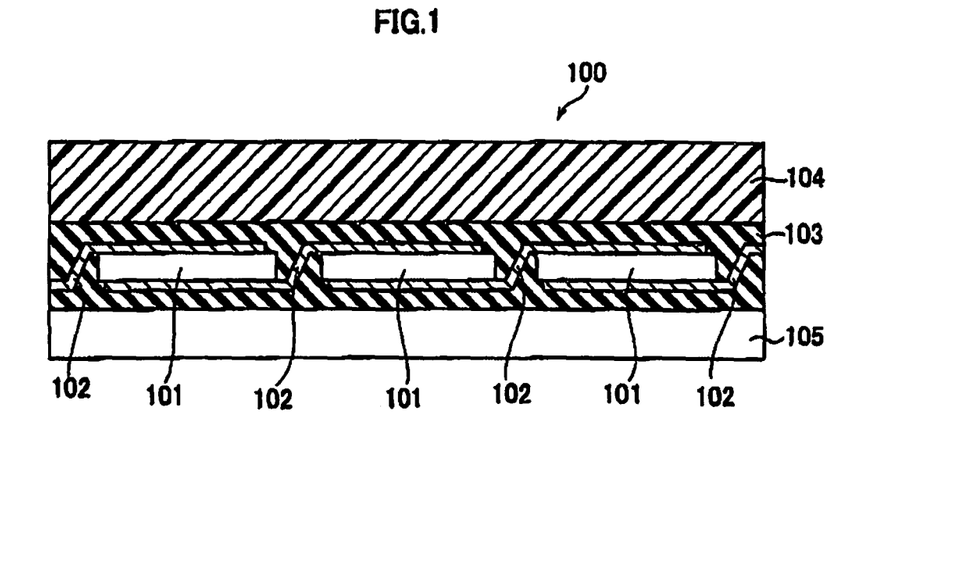
FIG. 1 is a cross-sectional view of a solar cell module including solar cells according to an embodiment.
Figure 2:
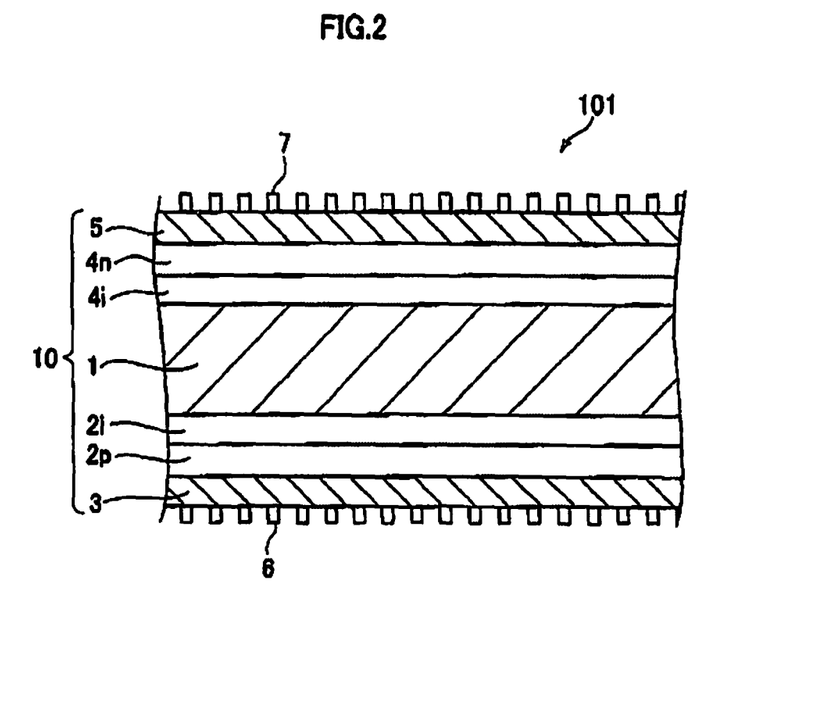
FIG. 2 is a cross-sectional view of the solar cell according to the embodiment.

A description will be made of a configuration of a solar cell module 100 according to this embodiment by using FIG. 1 and FIG. 2. FIG. 1 is a cross-sectional view of the solar cell module 100 according to this embodiment. FIG. 2 is an enlarged cross-sectional view of each of solar cells 101 according to this embodiment. Note that, in FIG. 2, a lower surface is shown as a light receiving surface of the solar cell 101.

The solar cell module 100 includes: the solar cells 101; wiring members 102; sealing member 103; a light receiving surface-side protection member 104; and a back surface-side protection member 105.

As show in FIG. 2, the solar cell 101 includes: a photoelectric conversion part 10; light receiving surface-side collecting electrodes 6; and back surface-side collecting electrodes 7.

The photoelectric conversion part 10 generates carriers by receiving light. Each of the carriers refers to a pair of a hole and an electron, which is generated in such a manner that the light is absorbed to the photoelectric conversion part 10. The photoelectric conversion part 10 according to this embodiment has a semiconductor pin junction as a basic structure. Specifically, the photoelectric conversion part 10 includes an n-type single crystal silicon substrate 1, an i-type amorphous silicon layer 2i, a p-type amorphous silicon layer 2p, a transparent conductive film 3, an i-type amorphous silicon layer 4i, an n-type amorphous silicon layer 4n, and a transparent conductive film 5. On the light receiving surface (lower surface) side of the n-type single crystal silicon substrate 1, the i-type amorphous silicon layer 2i, the p-type amorphous silicon layer 2p, and the transparent conductive film 3 are sequentially stacked. Moreover, on the back surface (upper surface) side of the n-type single crystal silicon substrate 1, the i-type amorphous silicon layer 4i, the n-type amorphous silicon layer 4n, and the transparent conductive film 5 are sequentially stacked.

Here, a side surface of the photoelectric conversion part 10 includes fractured surface which is fractured by bending the photoelectric conversion part 10 concerned. The fractured surface is not parallel to cleavage planes of the n-type single crystal silicon substrate 1. A description will be made later in detail of a fracturing method for forming the fractured surface.

The light receiving surface-side collecting electrodes 6 are formed into a comb shape on the light receiving surface of the transparent conductive film 3. The back surface-side collecting electrodes 7 are formed into a comb shape on a back surface of the transparent conductive film 5. The light receiving surface-side collecting electrodes 6 and the back surface-side collecting electrodes 7 collect such photogenerated carriers generated in such a manner that the photoelectric conversion part 10 receives the light.

The solar cell module 100 including the solar cells 101 with the configuration as described above is called an HIT solar cell module. The solar cells 101 are electrically connected to one another by the wiring members 102.

The sealing member 103 seals the plurality of solar cells 101 electrically connected to one another by the wiring members 102. The sealing member 103 can be formed of a resin material such as ethylene vinyl acetate (EVA) and polyvinyl butyral (PVB).

The light receiving surface-side protection member 104 is composed by using a member that transmits therethrough much of light with wavelengths absorbable by the solar cells 101. Glass, plastics and the like can be used as the light receiving surface-side protection member 104.

The back surface-side protection member 105 is a film of resin such as polyethylene terephthalate (PET), a resin film on which an evaporated film of a metal oxide such as alumina is formed, a metal film such as aluminum foil, or a film formed by stacking these films.

Method for Manufacturing Solar Cell Module

A description will be made of a method for manufacturing the solar cell module 100 according to this embodiment.

Figure 3:
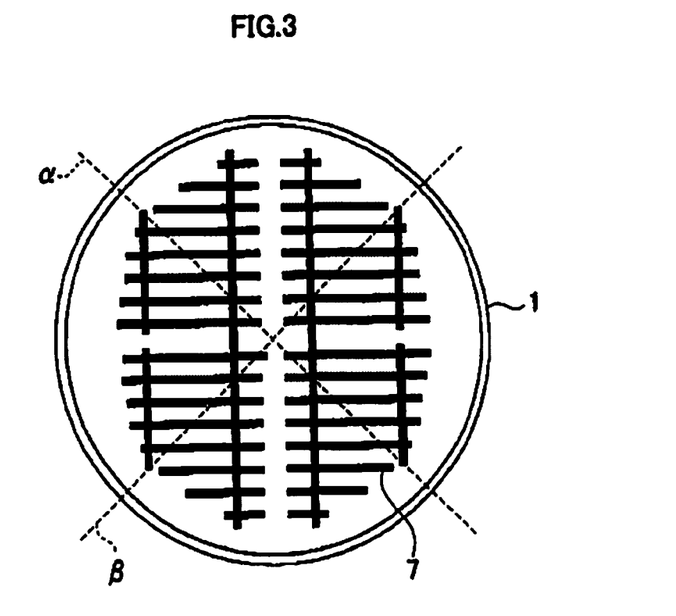
FIG. 3 is a plan view of the solar cell according to the embodiment.

First, the disc-like n-type single crystal silicon substrate 1 having a (100) plane, which is obtained by thinly cutting ingot-like n-type single crystal silicon, is prepared. Here, as shown in FIG. 3, the n-type single crystal silicon substrate 1 has a first cleavage plane ((011) plane) shown by a reference line α, and a second cleavage plane ((0-1-1) plane) shown by a reference line β. Moreover, the reference line α and the reference line β are perpendicular to each other.

Next, the n-type single crystal silicon substrate 1 is subjected to an etching process, whereby minute irregularities are formed on a surface of the n-type single crystal silicon substrate 1.

Next, the i-type amorphous silicon layer 2i and the p-type amorphous silicon layer 2p are sequentially stacked on the light receiving surface of the n-type single crystal silicon substrate 1 by using a vapor deposition method. In a similar way, the i-type amorphous silicon layer 4i and the n-type amorphous silicon layer 4n are sequentially stacked on the back surface of the n-type single crystal silicon substrate 1.

Next, by using a sputtering method, an ITO film (the transparent conductive film 3) is formed on the light receiving surface of the p-type amorphous silicon layer 2p. In a similar way, an ITO film (the transparent conductive film 5) is formed on the back surface of the n-type amorphous silicon layer 4n. In such a way, the disc-like photoelectric conversion part 10 that has the pin junction and uses the disc-like n-type single crystal silicon substrate 1 is formed.

Next, by using a printing method, a silver paste is formed into a comb shape on the light receiving surface of the ITO film (the transparent conductive film 3). In such a way, the light receiving surface-side collecting electrodes 6 are formed on the light receiving surface of the photoelectric conversion part 10. In a similar way, the silver paste is formed into a comb shape on the back surface of the ITO film (the transparent conductive film 3). In such a way, the back surface-side collecting electrodes 7 are formed on the back surface of the photoelectric conversion part 10. As shown in FIG. 3, the back surface-side collecting electrodes 7 axe formed so as not to be parallel to the reference line α and the reference line β. FIG. 3 shows the back surface-side collecting electrodes 7 formed on the back surface of the photoelectric conversion part 10. Note that, though not shown, the light receiving surface-side collecting electrodes 6 are formed substantially symmetrically to the back surface-side collecting electrodes 7 on the light receiving surface of the photoelectric conversion part 10.

Next, the silver pastes are heated under predetermined conditions. In such a way, the disc-like solar cell 101 is manufactured.

Next, in response to a pattern of the comb shape into which the back surface-side collecting electrodes 7 are formed, dividing grooves are formed on the back surface side of the photoelectric conversion part 10. Next, the photoelectric conversion part 10 is fractured along the dividing grooves. In this embodiment, in response to the pattern of the comb shape into which the back surface-side collecting electrodes 7 are formed, the photoelectric conversion part 10 is fractured, and is thereby divided into four. Note that a method for fracturing the photoelectric conversion part 10 will be described later in detail.

Next, the light receiving surface-side collecting electrodes 6 formed on the light receiving surface of one solar cell 101 and the back surface-side collecting electrodes 7 formed on the other solar cell 101 adjacent thereto are electrically connected to each other by the wiring member 102.

Next, on a glass substrate (the light receiving surface-side protection member 104), an EVA sheet (the sealing member 103), the plurality of solar cells 101 connected to one another by the tabs, an EVA sheet (the sealing member 103), and a PET film (the back surface-side protection member 105) are sequentially stacked, and a stacked body is formed.

Next, the stacked body is heated under predetermined conditions, whereby the EVA is cured.

In such a way, the solar cell module 100 is manufactured. Note that a terminal box, an Al frame and the like can be attached onto the solar cell module 100.

Method for Fracturing Solar Cell 101

Figure 4:
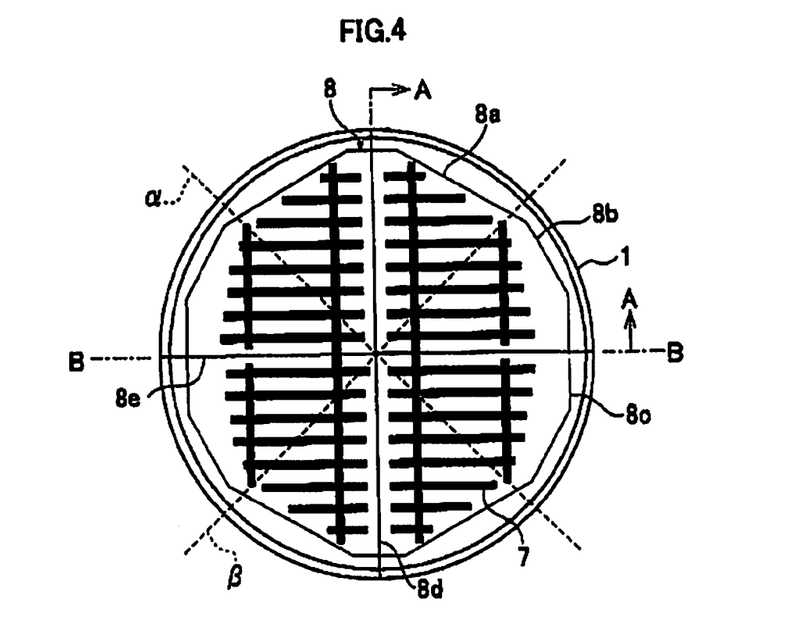
FIG. 4 is a view for explaining a method for fracturing the solar cell according to the embodiment (No. 1).
Figure 5:
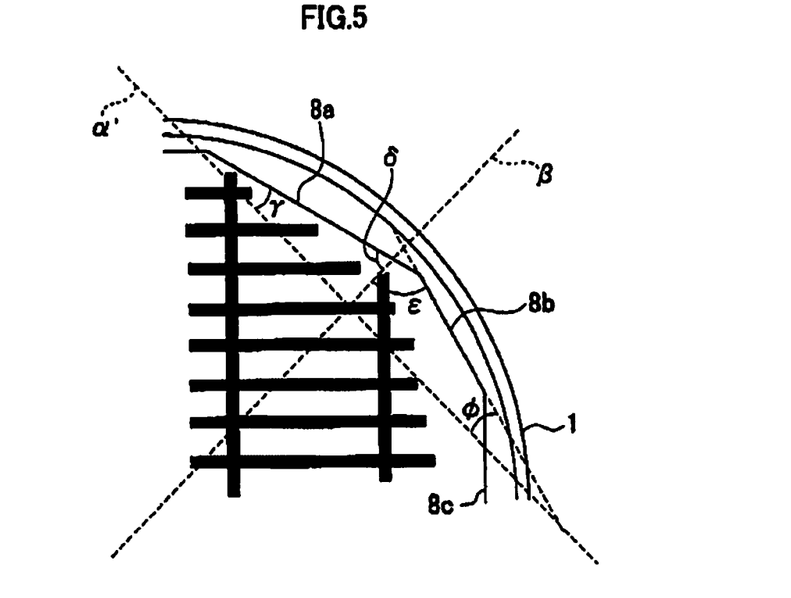
FIG. 5 is an enlarged view of a portion cut along a line A-A of FIG. 4.
Figure 6:
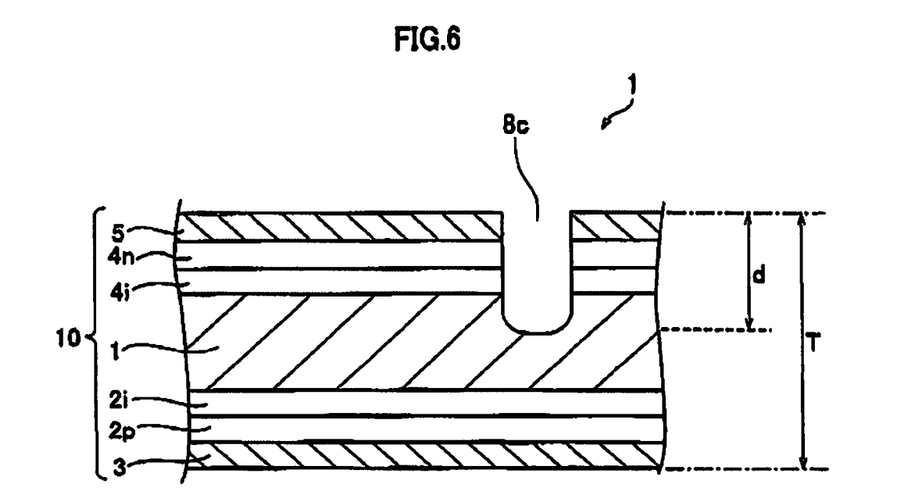
FIG. 6 is an enlarged view of a cross section cut along a line B-B of FIG. 4.

Next, by using the drawings, a description will be made of a method for fracturing the solar cell 101. FIG. 4 shows dividing grooves 8 formed on the back surface of the solar cell 101. FIG. 5 is an enlarged view of a portion cut along a line A-A of FIG. 4. FIG. 6 is an enlarged view of a cross section cut along a line B-B of FIG. 4.

First, a laser beam is irradiated from the back surface side of the solar cell 101 by using a YAG laser and the like, whereby the dividing grooves 8 are formed. As irradiation conditions of the YAG laser, a wavelength of a second harmonic can be set at 400 nm or more, a frequency can be set at 1 kHz to 50 kHz, a beam diameter can be set at 20 to 200 μm, and an output can be set at 1 to 25 W. By using such irradiation conditions, the dividing grooves 8 which have a width substantially equal to the beam diameter of the laser beam are formed.

Here, as shown in FIG. 4, the dividing grooves 8 according to this embodiment are formed so as not to be parallel to the reference line α and the reference line β. Specifically, the dividing grooves 8 are not parallel to a first cleavage plane (the (011) plane) and second cleavage plane (the (0-1-1) plane) of the n-type single crystal silicon substrate 1.

Specifically, as shown in FIG. 5, the dividing groove 8a has an inclination of an angle γ (approximately 15 degrees) with respect to a reference line α' as a parallel line to the reference line α, and has an inclination of an angle δ (approximately 75 degrees) with respect to the reference line β. Moreover, the dividing groove 8b has an inclination of an angle ø (approximately 15 degrees) with respect to the reference line α', and has an inclination of an angle ϵ (approximately 75 degrees) with respect to the reference line β. As described above, all of the dividing grooves 8 have inclinations with respect to the reference line α and the reference line β. Note that magnitudes of the inclinations of the dividing grooves 8 with respect to the reference line α and the reference line β can be set arbitrarily. Moreover, the dividing grooves 8 just need to have inclinations with arbitrary magnitudes with respect to the reference line α and the reference line β, and can be formed at arbitrary positions in response to the pattern of the back surface-side collecting electrodes 7 formed on the photoelectric conversion part 10.

As shown in FIG. 6, with respect to a thickness T (approximately 140 μm to approximately 190 μm) of the photoelectric conversion part 10, each of the dividing grooves 8 according to this embodiment has a depth d (approximately 60 μm to approximately 80 μm) from the back surface side of the photoelectric conversion part 10. The depth d of the dividing groove 8 can be arbitrarily set without being limited to the above; however, it is preferable that the depth d should not reach the p-type amorphous silicon layer 2p.

Next, the photoelectric conversion part 10 is bent along the dividing grooves 8, whereby the photoelectric conversion part 10 is fractured along the dividing grooves 8.

Figure 7:
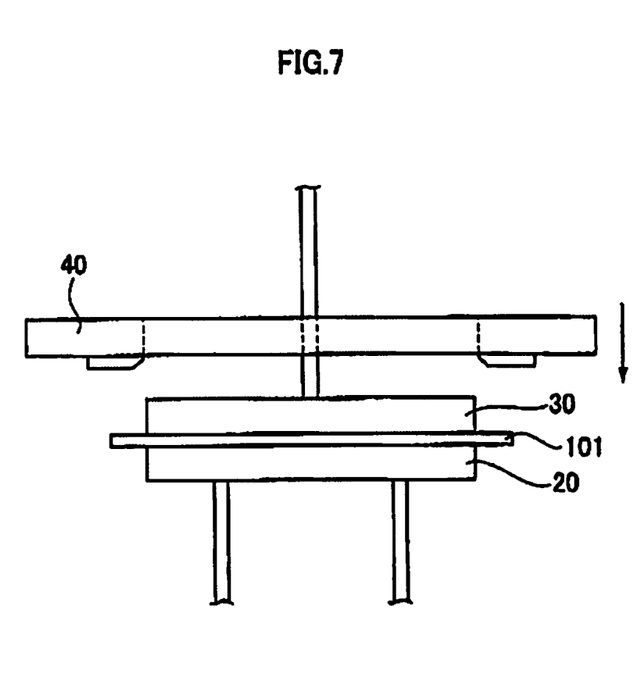
FIG. 7 is a side view showing a fracturing apparatus for use in fracturing the solar cell according to the embodiment.
Figure 8A:
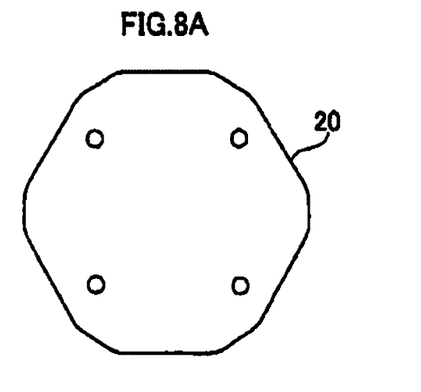
Figure 8B:
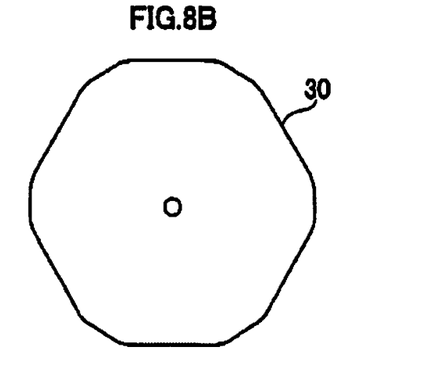
Figure 8C:
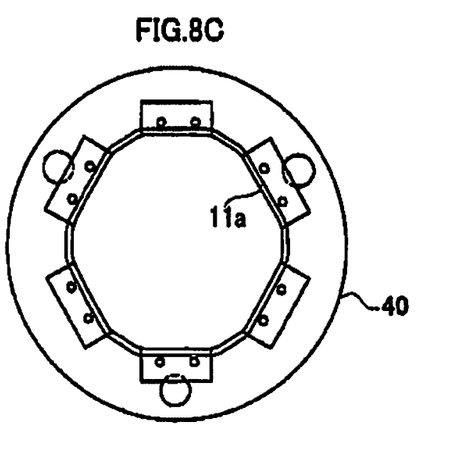
Figure 9:
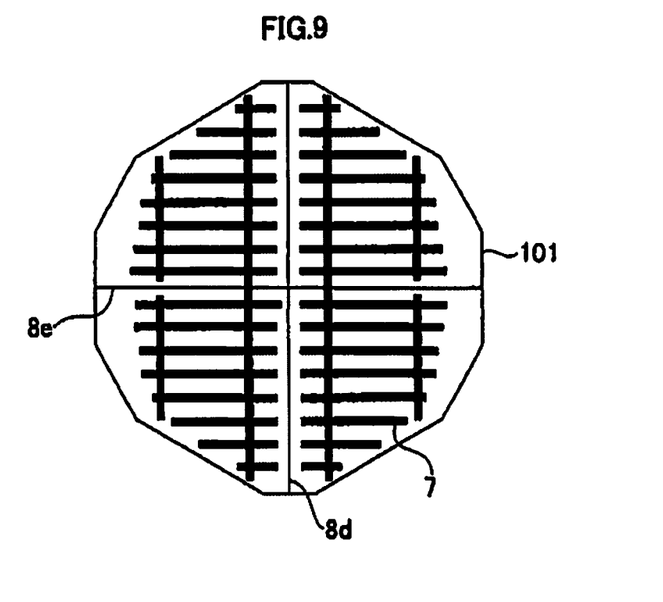
FIG. 9 is a view for explaining the method for fracturing the solar cell according to the embodiment (No. 2).

Specifically, first, as shown in FIG. 7, the solar cell 101 is fixed between a mounting stage 20 and a press member 30. Next, a fracturing blade 40 is moved downward, whereby the photoelectric conversion part 10 is fractured along the dividing grooves 8 (excluding the dividing grooves 8d and 8e). Specifically, a fringe portion of the photoelectric conversion part 10 is bent toward the downward direction, whereby the photoelectric conversion part 10 is fractured. Note that, as shown in FIGS. 8A to 8C, the mounting stage 20, the press member 30 and the fracturing blade 40 have the same shape and substantially the same dimension as those of the dividing grooves 8 (excluding the dividing grooves 8d and 8e) when viewed from the above. In such a way, the fringe portion of the solar cell 101 is fractured away, and the solar cell 101 is formed into a polygonal shape as shown in FIG. 9.

Figure 10:
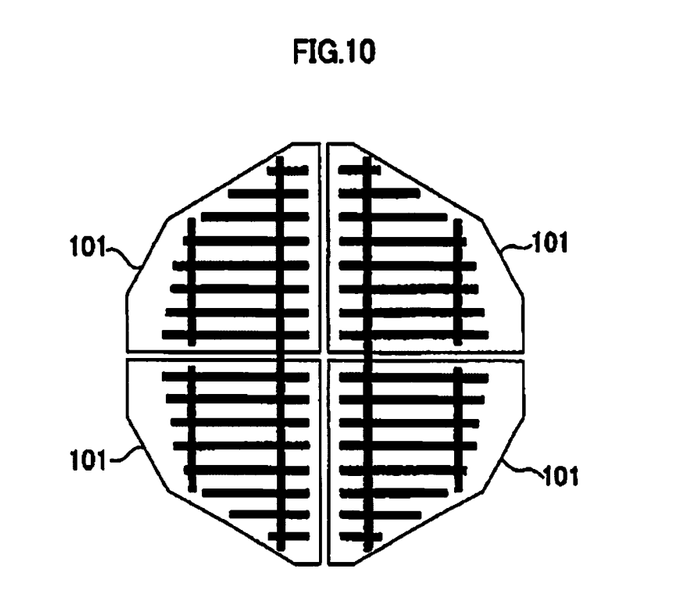
FIG. 10 is a view for explaining the method for fracturing the solar cell according to the embodiment (No. 3).

Subsequently, the photoelectric conversion part 10 is bent along the dividing grooves 8d and 8e, whereby the photoelectric conversion part 10 is fractured along the dividing grooves 8d and 8e. The fracturing of the photoelectric conversion part 10 along the dividing grooves 8d and 8e is performed by bending the photoelectric conversion part 10, and there are no limitations on a bending order. For example, the photoelectric conversion part 10 is fractured along the dividing groove 8d to be thereby divided into two, and thereafter, the respective divided pieces are fractured along the dividing groove 8e. As a result, the solar cell 101 is divided into four as shown in FIG. 10.

The solar cells 101 formed as described above are electrically connected to one another by the wiring members.

Function and Effect

In accordance with the method for fracturing the solar cell according to this embodiment, the dividing grooves 8 are formed so as not to be parallel to the first cleavage plane ((011) plane) and second cleavage plane ((0-1-1) plane) of the n-type single crystal silicon substrate 1. Moreover, the photoelectric conversion part 10 is bent along the dividing grooves 8, whereby the photoelectric conversion part 10 is fractured along the dividing grooves 8.

As described above, the dividing grooves 8 are not parallel to the cleavage planes of the n-type single crystal silicon substrate 1. Accordingly, in the case of fracturing the photoelectric conversion part 10, uniform force can be applied to all the dividing grooves 8. Specifically, in the case of fracturing the photoelectric conversion part 10, a stress is not concentrated on a part of the n-type single crystal silicon substrate 1.

Hence, the photoelectric conversion part 10 can be fractured without causing breakage failure on the n-type single crystal silicon substrate 1, and accordingly, yield in a fracturing step for the solar cell 101 can be enhanced.

Other Embodiments

Although the present invention has been described by the above-described embodiment, it should not be understood that the description and the drawings, which form a part of this disclosure, limit the present invention. From this disclosure, a variety of alternative embodiments, examples and operation technologies will be obvious for those skilled in the art.

For example, though the n-type single crystal silicon substrate 1 is used in the above-described embodiment, a p-type single crystal silicon substrate can be used. In this case, an i-type amorphous silicon layer and an n-type amorphous silicon layer just need to be sequentially stacked on a light receiving surface side of the p-type single crystal silicon substrate, and an i-type amorphous silicon layer and a p-type amorphous silicon layer just need to be sequentially stacked on a back surface side of the p-type single crystal silicon substrate.

Moreover, though the n-type single crystal silicon substrate 1 is used in the above-described embodiment, a compound semiconductor substrate can be used. For example, in the case of using a GaAs substrate, the dividing grooves 8 just need to be formed so as not to be parallel to a first cleavage plane ((110) plane) and second cleavage plane ((1-10) plane) of the GaAs substrate.

Moreover, though the description has been made of the case where the photoelectric conversion part 10 has the semiconductor pin junction using the n-type single crystal silicon substrate 1 in the above-described embodiment, the photoelectric conversion part 10 may have a semiconductor pn junction using a semiconductor substrate. In this case, p-type or n-type dopant is doped into a surface of an n-type or p-type crystalline semiconductor substrate, whereby the pn junction can be formed.

Moreover, though the description has been made of the method for fracturing the solar cell 101 using the n-type single crystal silicon substrate 1 in the above-described embodiment, the present invention can also be applied to a semiconductor substrate of other than the solar cell.

Moreover, though the light receiving surface-side collecting electrodes 6 and the back surface-side collecting electrodes 7 are formed into the comb shape in the above-described embodiment, the forming pattern of these can be designed arbitrarily.

Moreover, though the disc-like solar cell 101 is fractured to be thereby divided into four in the above-described embodiment, there are no limitations on the shape of the solar cells 101 after being fractured. Hence, the forming pattern of the dividing grooves 8 is not limited to that described in the above-described embodiment, either.

Moreover, though the fringe portion of the disc-like solar cell 101 is fractured in a lump by using the fracturing apparatus in the above-described embodiment, the fringe portion does not have to be always fractured in a lump, and for example, pairs of the dividing grooves formed parallel to each other can be fractured one by one.

What is claimed is:

1. A method for manufacturing a solar cell, comprising:
    forming irregularities on a crystal semiconductor substrate by an etching process as well as forming a photoelectric conversion part having a semiconductor pn junction or a semiconductor pin junction;
    forming collecting electrodes on the photoelectric conversion part;
    forming dividing grooves by irradiating the photoelectric conversion part with a laser beam; and
    fracturing the photoelectric conversion part along the dividing grooves by bending the photoelectric conversion part along the dividing grooves, wherein
    the dividing grooves are not parallel to a cleavage plane of the crystal semiconductor substrate on which the irregularities are formed by the etching process.

2. A method for manufacturing a solar cell according to claim 1, wherein the crystal semiconductor substrate consists of a silicon crystal substrate, and
    the cleavage plane is (100) plane and (0-1-1) plane.

3. A method for manufacturing a solar cell according to claim 2, wherein the etching process is a wet alkaline anisotropic etching process.

4. A method for manufacturing a solar cell according to claim 2, wherein the dividing grooves have a width substantially equal to a beam diameter of the laser beam.

5. A method for manufacturing a solar cell according to claim 2, wherein forming of the dividing grooves are performed after forming the collecting electrodes.

6. A method for manufacturing a solar cell according to claim 2, the photoelectric conversion part has the semiconductor pn junction formed by doping a dopant into the crystal semiconductor substrate.

7. A method for manufacturing a solar cell, comprising:
    forming irregularities on a crystal semiconductor substrate consisting of a silicon crystal substrate by an etching process, and forming a photoelectric conversion part having a semiconductor pn junction by doping a dopant;
    forming collecting electrodes on the photoelectric conversion part;
    forming dividing grooves by irradiating the photoelectric conversion part with a laser beam; and
    fracturing the photoelectric conversion part along the dividing grooves by bending the photoelectric conversion part along the dividing grooves, wherein
    the dividing grooves are not parallel to (100) plane and (0-1-1) plane being a cleavage plane of the crystal semiconductor substrate on which the irregularities are formed by the etching process.

* * * * *